(12) United States Patent
Couillard

(10) Patent No.: US 7,527,541 B2
(45) Date of Patent: May 5, 2009

(54) OLED STRUCTURES WITH BARRIER LAYER AND STRAIN RELIEF

(75) Inventor: James G. Couillard, Ithaca, NY (US)

(73) Assignee: Corning Incorporated, Corning, NY (US)

( * ) Notice: Subject to any disclaimer, the term of this patent is extended or adjusted under 35 U.S.C. 154(b) by 344 days.

(21) Appl. No.: 11/598,898

(22) Filed: Nov. 14, 2006

(65) Prior Publication Data
US 2007/0077850 A1    Apr. 5, 2007

(51) Int. Cl.
*H01J 9/00* (2006.01)
(52) U.S. Cl. ...................................... 445/23
(58) Field of Classification Search ............ 445/23–25; 313/512
See application file for complete search history.

(56) References Cited

U.S. PATENT DOCUMENTS

| 6,268,695 | B1 | 7/2001 | Affinito ..................... 313/504 |
| 6,306,510 | B1 | 10/2001 | Verlinden et al. .......... 428/426 |
| 6,309,901 | B1 | 10/2001 | Tahon et al. ................ 438/29 |
| 6,597,111 | B2 | 7/2003 | Silvernail et al. ............. 438/29 |
| 6,835,950 | B2 | 12/2004 | Brown et al. ................. 257/40 |
| 2002/0140347 | A1 | 10/2002 | Weaver ....................... 313/506 |

FOREIGN PATENT DOCUMENTS

WO    WO00/65670 A    11/2000

OTHER PUBLICATIONS

Couillard, et al "Chemical Treatment of Glass Substrates", Journal of Non-Crystalline Solids 222 (1997) 426-434.
Chatham, et al "Review Oxygen Diffusion Barrier Properties of Transparent Oxide Coatings on Polymeric Substrates"; Surface and Coatings Technology 78 (1996) 1-9.

*Primary Examiner*—Joseph L Williams
(74) *Attorney, Agent, or Firm*—Kevin M. Able

(57) ABSTRACT

An OLED structure includes a substantially flexible substrate, and at least one barrier layer disposed between the substrate and the OLED structure. The barrier layer substantially prevents contaminants from permeating a layer of organic material or the OLED structure. The barrier layer includes a glass layer that has certain components added or removed to improve its flexibility. The OLED structure may also include a substantially flexible substrate and at least one barrier layer disposed between the substrate and the OLED structure. The barrier layer includes a strain relief material. The strain relief material advantageously has at least one axis of orientation. Photonic or electronic components, or both could be substituted for the OLED.

11 Claims, 3 Drawing Sheets

OLED STRUCTURES WITH BARRIER LAYER AND STRAIN RELIEF

BACKGROUND

Organic light emitting devices/diodes (OLEDs) are light emitting devices are often made from electroluminescent polymers and small-molecule structures, for example. These devices have received a great deal of attention as alternatives to conventional light sources in displays as well as other applications. In particular, an OLED may an alternative to liquid crystal (LC) materials and structures in displays, because the LC materials and structures tend to be more complicated in form and more limited in application.

OLED-based displays do not require a light source (backlight) as needed in LC displays. OLEDs are a self-contained light source, and as such are much more compact while remaining visible under a wider range of conditions. Moreover, unlike LC displays which rely on a fixed. cell gap, OLED-based displays can be flexible.

While OLEDs provide a light source for display and other applications with at least the benefits referenced above, there are certain considerations and limitations that can reduce their practical implementation. One issue to be considered when using OLED materials is their susceptibility to environmental contamination. In particular, exposure of an OLED display to water vapor or oxygen can be deleterious to the organic material and the structural components of the OLED. As to the former, the exposure to water vapor and oxygen can reduce the light emitting capability of the organic electroluminescent material itself. As to the latter, for example, exposure of the reactive metal cathode commonly used in OLED displays to these contaminants can over time result in 'darkspot' areas and reduce the useful life of the OLED device. Accordingly, it is beneficial to protect OLED displays and their constituent components and materials from exposure to environmental contaminants such as water vapor and oxygen.

In order to minimize environmental contamination, OLED displays are commonly fabricated on thick, rigid glass substrates, with a glass or metal cover sealed at the edges. However it is often desirable to provide the OLEDs on a lightweight flexible substrate. For example, it would be beneficial to use thin plastic (e.g. polymer) substrates in this manner. Unfortunately plastic substrates, such as polycarbonate, are unacceptably susceptible to water vapor and oxygen permeation. While the use of inorganic layers such as $SiO_x$, $SiN_x$ and $Al_2O_3$ has been investigated as transparent barrier layers to moisture and oxygen, the layers formed of these materials are typically brittle, and thus not useful in flexible substrate applications. Other proposed barrier layers include multi-layer structures, which are rather complex and can also be brittle.

What is needed therefore is a barrier structure that overcomes at least the shortcomings described above.

SUMMARY

In accordance with an example embodiment, an OLED structure includes a substantially flexible substrate, and at least one barrier layer disposed between the substrate and the OLED structure. The barrier layer substantially prevents contaminants from permeating a layer of organic material or the OLED structure. Illustratively, the barrier layer includes a glass layer that has certain components added or removed to improve its flexibility.

In accordance with another example embodiment, a barrier penetration structure includes a substantially flexible substrate and at least one barrier layer disposed between the substrate and an electronic or photonic structure. The barrier layer includes a strain relief material. The strain relief material advantageously has at least one axis of orientation.

In accordance with another example embodiment, a method of forming a barrier layer includes providing a multi-component glass layer between a substrate and a layer of organic material, and selectively removing at least one component of, or selectively adding at least one component to, the multi-component glass to change the composition of the multicomponent glass into the barrier layer.

BRIEF DESCRIPTIONS OF THE DRAWINGS

The exemplary embodiments are best understood from the following detailed description when read with the accompanying drawing figures. It is emphasized that the various features are not necessarily drawn to scale. The dimensions may be arbitrarily increased or decreased for clarity of discussion.

DETAILED DESCRIPTION

In the following detailed description, for purposes of explanation and not limitation, example embodiments disclosing specific details are set forth in order to provide a thorough understanding of the present invention. However, it will be apparent to one having ordinary skill in the art having had the benefit of the present disclosure that the present invention may be practiced in other embodiments that depart from the specific details disclosed herein. Moreover, descriptions of well-known devices, methods and materials may be omitted so as to not obscure the description of the present invention.

In the example embodiments described herein, structures for OLED's are set forth in significant detail. It is noted, however, that this is merely an illustrative implementation of the invention. To wit, the invention is applicable to other technologies that are susceptible to similar problems as discussed above. For example, embodiments in electronics and photonics are clearly within the purview of the present invention. These include but are not limited to integrated circuits and semiconductor structures.

Figure 1:
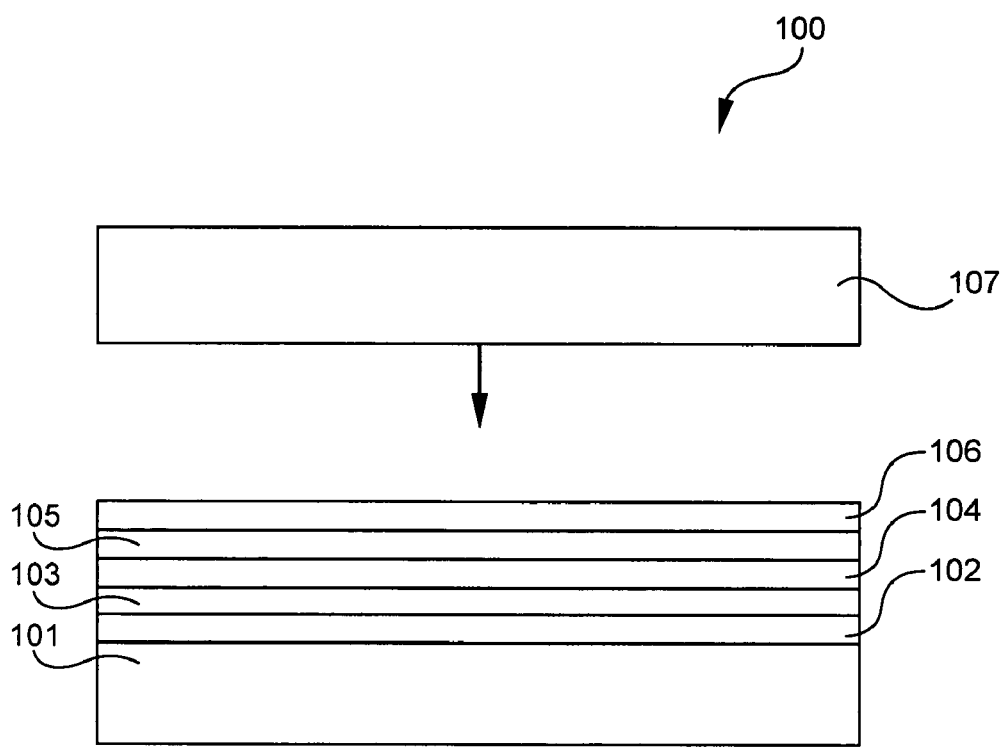
FIG. 1 is a cross-sectional view of an OLED structure in accordance with an example embodiment.

FIG. 1 shows an OLED structure 100 including at least one barrier layer 102 in accordance with an example embodiment. A substrate 101 is a relatively flexible layer of material, suitable for use in OLED display applications. This substrate may be a layer of suitable material, which is transparent and suitably flexible for the intended purposes of the OLED structure. For purposes of illustration, the substrate may be a polymer such as polycarbonate, polyolefin, polyether sulfone (PES), polyethylene terephthalate (PET), polyethylene naphthalate (PEN), polyimide, and others. However it may also be comprised of other flexible materials including paper, fabric, metal foils. Furthermore, layers of these materials may be used in various and sundry combinations.

As mentioned previously, the substrate 101 is advantageously flexible. However, flexible substrates such as the polymer substrates referenced above are also characteristically unacceptably permeable for OLED applications. To wit, the permeation rates of oxygen and water vapor through these materials are several orders of magnitude too high to permit useful lifetimes of OLED displays. Accordingly, a barrier layer 102 is disposed over the substrate. The barrier layer 102 has certain beneficial characteristics described herein and is formed by illustrative methods described below.

An electrical contact layer 103 of a first polarity is disposed over the barrier layer 102. One or more electroluminescent organic layers 104 are disposed over the contact layer 103, and an electrical contact layer 105 of a second polarity is disposed over the organic layer. The OLEDs are formed from the organic layers 104, and are powered via the contact layers 103 and 105. The materials chosen for the organic layers 104 and the contact layers 103 and 105, as well as their function in effecting OLED operation, are well-known to one skilled in the art. As such, details of these materials and devices are omitted so as to not obscure the illustrative embodiments.

Another barrier layer 106, which is substantially identical to the barrier layer 102, is optionally disposed over the second contact layer 105. This layer beneficially prevents the permeation of contaminants through to active layers 103, 104, and 105 from paths other than through substrate 101. Another optional layer 107, which is substantially identical in material and thickness to the substrate 101 may be disposed over the barrier layer 106. Layers 106 and 107 may be used separately or in conjunction. Moreover, it is noted additional barrier layers that are substantially identical to layers 102 and 106 may be disposed beneath and above the active layers 103, 104, and 105 to further mitigate the permeation of contaminants. Advantageously, these layers will also provide the desired flexibility. Illustratively, either one or both of barrier layers 102 and 106 are substantially transparent in the visible region (i.e., over the wavelengths in the range of approximately 400 nm to approximately 800 nm). Finally, it is noted that other layers may be disposed between the barrier layers as needed, affording a number of options to the designer of OLED devices. These layers may include color filters, antireflection coatings, scattering films, lenses, metal layers, or other layers of function and materials known to those skilled in the art.

The barrier layers 102 and 106 are illustratively multicomponent glass materials, which are chosen for their barrier properties against certain contaminants such as water vapor and oxygen. The material chosen for the barrier layers characteristically prevents the permeation of water vapor and oxygen in an example embodiment. However, the material may be chosen for its ability to prevent the permeation of other substances that can adversely impact the organic layer 104, or the contact layers 103 and 105, or both.

In accordance with an illustrative embodiment, the barrier layers 102 and 106 are a deposited inorganic multicomponent glass. For example the barrier layers may be $Mg_xAl_ySi_zO$ or Aluminoborosilicate glass, which has been treated to either remove one or more constituents or to add one or more components to alter the composition and the physical properties of the glass. In an example embodiment, the barrier layers 102 and 106 have a thickness in the range of approximately 50 nm to approximately 1000 nm.

The modifying of the glass layer by leaching or impregnation is carried out to improve its flexibility, or its cracking or impact resistance, or a combination of these characteristics. As such, the glass to be chosen for its barrier qualities as to one or more contaminants, and the leaching or impregnation of the constituents is carried out to foster desirable flexibility and/or cracking or impact resistance. Alternatively, a flexible glass may be treated to improve the permeation resistance of a thin layer at the surface.

In an exemplary embodiment, a glass material in keeping with the description above having been leached of or impregnated with at least one component provides a barrier to water vapor so that its permeation through the barrier is less than approximately $10^{-6}$ g/m$^2$/day and the permeation of oxygen through the barrier is less than approximately $10^{-5}$ cm$^3$/m$^2$/day.

Figure 2:
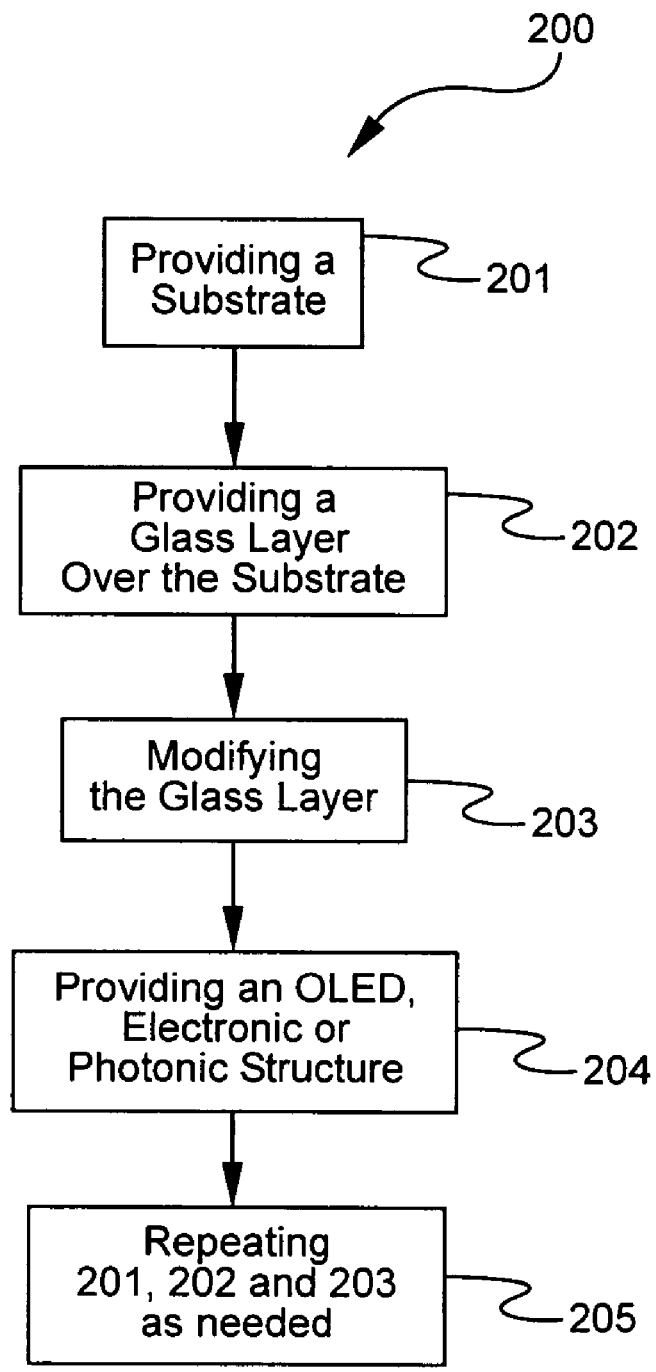
FIG. 2 is a flow chart of a process of forming a barrier layer in accordance with an example embodiment.

FIG. 2 shows flow-chart of a method 200 of fabricating a barrier layer in accordance with an example embodiment. The method 200 includes providing a substrate at step 201. The substrate is substantially the same as the substrate 101 or layer 107 described in connection with the example embodiments of FIG. 1. After providing the substrate, a glass layer is provided at step 202. This glass layer is of a material having the desirable permeability characteristics as described above, and in a subsequent step is modified to improve its flexibility characteristics, or its permeability characteristics, or both. The material chosen for this glass is illustratively one of the inorganic glass materials described above, and is deposited over the structure by standard deposition techniques. The materials are preferably vacuum deposited by methods such as sputtering, chemical vapor deposition, plasma enhanced chemical vapor deposition, evaporation, or combinations of these known methods.

After the glass layer is deposited at step 202, the glass is modified by either leaching at least one component from the glass, or impregnating at least one component to the glass, or both. In an example embodiment, the deposited glass is a multicomponent glass such as one of the glass materials discussed above. These multicomponent glasses are susceptible to leaching of at least one component of the glass by chemical exposure. For example, the leaching process may be carried out by methods described in *Chemical treatment of glass substrates*, by J. Gregory Couillard, et al. Journal of Non-Crystalline Solids, 222 429-434 (1997), the disclosure of which is specifically incorporated herein by reference. Alternative methods include, but are not limited to, ion exchange and electromigration of cations within the glass.

Alternatively, in the event that the modification of the glass to achieve the requisite characteristics referenced above is by impregnating at least one component, the modification of the glass layer of step 203 may be by solution chemistry such as ion exchange or diffusion doping, or by plasma processing such as ion implantation. The material chosen for impregnation of the glass is chosen for its ability to alter the material characteristics of the glass. These material characteristics are illustratively flexibility resistance to cracking or impact breakage. For example, barium (Ba) may be used as an impregnation material in the glass materials referenced above to meet this desired end. Of course, this is merely illustrative, and other materials may be used in this manner. Finally, it is noted that constituent materials of the glass may also be used in this capacity.

Finally, it is noted that the chemical modification of the glass layer of step 203 may be carried out to create regions where the barrier layer has differing properties. This may be carried out by performing the chemical modification, either leaching or impregnating the glass, using a patterned film or mask. As an example, it may be desirable to constrain flexure of individual pixels, but allow flexure of the substrate between pixels.

After the modification of the glass is completed at step 203, the OLED structure is provided as shown at step 204. This includes, but is not limited to providing the contact layers, the organic layer, and any other components needed to fabricate the OLED devices. The details of these steps are known to one skilled in the art, and are substantially unrelated to the description of the example embodiment. In the interest of clarity of description of the example embodiments, these details are foregone. Moreover, it is noted that in example embodiments for providing barrier layers in photonic and electronic applications, step 204 would include the providing of the electronic, or photonic structure, or both.

Finally, at step 205, it is noted that the processing of the glass, and the fabrication of additional layers and elements may be repeated as desired.

The barrier layers in accordance with example embodiments provide certain benefits. One beneficial aspect of these embodiments is the simplicity of the process of their fabrication. For example, by relatively straight-forward techniques of the example embodiments, a single layer may be used to fulfill the roles of two or more layers of known approaches. Material compatibility issues are also greatly reduced compared to known methods and materials. It is also noted that graded film compositions may also be used in keeping with the example embodiments.

Figure 3:
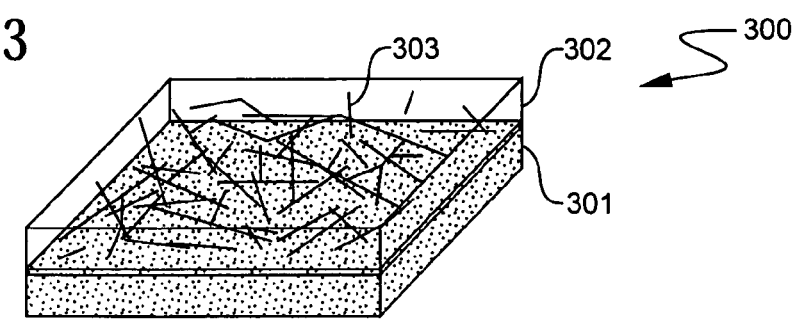
FIGS. 3 is a perspective view of a barrier layer in accordance with an example embodiment.

FIG. 3 shows a barrier layer 300 in accordance with another example embodiment. The barrier layer 300 is disposed over a substrate 301, which may be a substrate of an OLED device such as the OLED device of FIG. 1. Illustratively, the barrier layer 300 is a nanocomposite material useful in achieving the desired resistance to contaminants as well as the flexibility requirements described above.

The barrier layer 300 is a heterogeneous material that includes a glass layer 302, which has strain-relieving elements 303 disposed therein. The glass layer is a suitable material to prevent the permeation of water vapor and oxygen within the quantitative limits referenced above, while the strain-relieving elements 303 provide a requisite degree of flexibility to the material. For purposes of illustration, and not limitation, the glass layer may be $Mg_xAl_ySi_zO$, aluminoborosilicate glass, $SiO_x$, $SiN_x$ or $Al_2O_3$. The strain-relieving elements 303 are beneficially embedded strands of a material such as a suitable glass, polymer or clay.

Characteristically, the strain-relieving elements are substantially randomly oriented in the layer 302 providing elasticity to the glass layer 203, and thereby adapting the barrier layer 300 to flex in all directions. In this example embodiment the regions of included material may be quasi-spherical in shape, or may have a direction of orientation. In any event, the structure provided by the barrier layer enables the barrier characteristics needed, while allowing a substantial reduction in the strain on the barrier layer 300 caused by stretching or by resistance to stretching along a long axis of the barrier layer if the strain relieving material has a particular axis of orientation. The components of the composite layer may be deposited simultaneously, such as by known sol-gel processes, or individually. As an example of the latter, a network of polymer fibers is dispersed over the surface and a glass layer deposited by vacuum processes such as sputtering or chemical vapor deposition, thereby forming layer 302.

Figure 4:
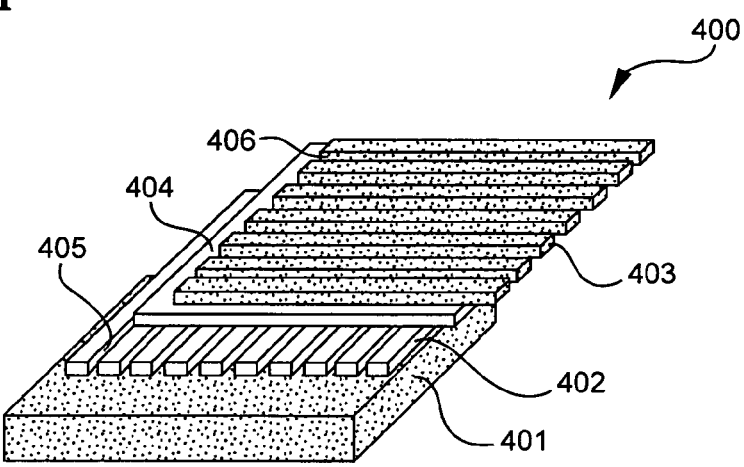
FIG. 4 is a perspective view of a barrier layer in accordance with an example embodiment.

Another example embodiment of a strain-relieving barrier layer is shown in FIG. 4. A barrier layer 400 according to this embodiment includes a substrate 401 with a first suitably impermeable strain-relief layer 402 and a second suitably impermeable strain relief layer 403. The strain relief layers have been divided into discrete segments, and thus provide a greater degree of strain relief than a continuous layer. The regions are of defined size and geometry, and are thus not random. The discrete regions are separated by gaps of non-zero width, preferably less than 100 μm. A flexible layer 404 is optionally disposed between the first and second strain relief layers 402 and 403. Additional strain relief layers similar to 402 and 403 may be repeated as desired, with layers similar to 404 provided between them.

The strain relief layers 402 and 403 beneficially include grooves 405 and 406 oriented in a certain direction as shown. In one example embodiment, the grooves or ribs 405 are substantially straight, with grooves 405 being orthogonal to grooves 406. Thereby the barrier layer 400 is provided with flexibility along one axis by one strain relief layer, and along another direction, which is perpendicular to the first direction, by the other strain relief layer. Ultimately, this fosters the required strain relief needed to provide flexibility of the OLED device in all directions, while maintaining the barrier properties desired.

In the example embodiment of FIG. 4, the strain-relief layers 402 and 403 including the grooves or ribs 405 and 406, respectively, are illustratively deposited through a shadow-mask by known techniques and in a particular orientation as shown. The strain relief layers 402 and 403 may be made of a variety of materials suitable for use in OLED applications, including, but not limited to polymer materials and glass materials such as those described above. Moreover, in addition to the fabrication technique referenced above, the strain relief layers may be fabricated by etching or scribing techniques, which are well known to one of ordinary skill in the art.

Figure 5:
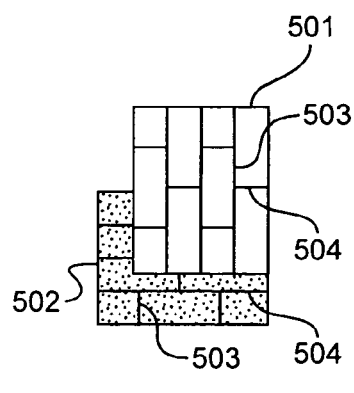
FIG. 5 is a perspective view of a barrier layer in accordance with an example embodiment.
Figure 6:
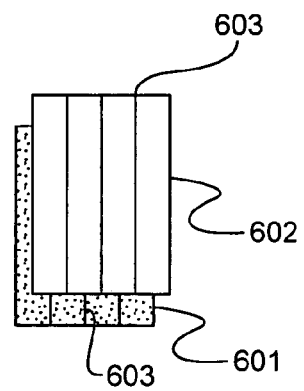
FIG. 6 is a perspective view of a barrier layer in accordance with an example embodiment.

The strain relief regions of layers 402 and 403 may be divided into other possible patterns than those shown. The strain relief regions may be arbitrary in shape and dimension, but are more preferably regular forms such as rectangles, triangles, hexagons, and other geometric shapes. FIGS. 5 and 6 show barrier layers in accordance with such other example embodiments. The barrier layers of the example embodiments of FIGS. 5 and 6 share certain common features with the example embodiments of FIG. 4, but differ in the arrangement of their discrete strain relief regions and their overlap with adjacent layers.

In the example embodiment of FIG. 5, a first barrier layer 501 is disposed over a second barrier layer 502. Each of the barrier layers 501, 502 have grooves formed therein. Like the barrier layer of the example embodiment of FIG. 4, the barrier layers 501 and 502 provide strain relief in multiple directions by having multiple patterned layers. These patterned layers have grooves 503 and 504, which are oriented in an orthogonal manner to one another, disposed over or directly on one another thereby providing the strain relief properties desired in the flexible barrier layer. It is noted however, that both layers 501 and 502 include strain relief in both directions, as opposed to having one layer provide strain relief in one direction, and another layer in another direction. It is further noted that other material layer(s) could be disposed between layers 501 and 502, and that additional barrier layers could be added to the stacking of barrier layers 501 and 502.

Illustratively, each of the barrier layers 501 and 502 are provided via a single material layer. The material layers are chosen for their barrier protection capabilities. The grooves 503 and 504, which provide the desired strain relief characteristics, do not substantially degrade the barrier penetration properties due to the overlapping effect of the pattern. In particular, as a result of the pattern of the grooves, there is very little overlap of the grooves of barrier layer 501 with the grooves of barrier layer 502. As such, there is there are substantially no paths for migration of contaminants through adjacent layers.

Illustratively, the barrier layers 501 and 502 are suitable glass materials having grooves formed therein by scribing or etching by known techniques. These glass materials are such as those described in connection with other example embodiments above.

Finally, another example embodiment shows barrier layers 601 and 602 having grooves 603 as shown. These layers are substantially identical to those described with the example embodiments of FIG. 5, but have a single groove orientation per barrier layer. The barrier layers 601 and 602 are oriented and disposed over one another so that the grooves 603 are not substantially orthogonal to one another, however there is very little overlap of the grooves of barrier layer 601 with the grooves of barrier layer 602. As such, there is there are substantially no paths for migration of contaminants through adjacent layers. This affords the strain relief and barrier penetration capabilities described above. Additionally, the barrier layers 601 and 602 may be disposed directly on one another or over one another with one or more material layers therebetween.

The example embodiments having been described in detail in connection through a discussion of exemplary embodiments, it is clear that modifications of the invention will be apparent to one having ordinary skill in the art having had the benefit of the present disclosure. Such modifications and variations are included in the scope of the appended claims.

The invention claimed is:

1. A method of forming a barrier layer comprising: providing a multi-component glass layer between a substrate and an active layer; and impregnating the multicomponent glass with barium ions to change the composition of the multicomponent glass into the barrier layer.

2. A method as recited in claim 1, wherein the active layer is an organic layer.

3. A method as recited in claim 2, wherein the organic layer comprises an OLED structure.

4. A method as recited in claim 1, wherein the active layer includes an electronic structure.

5. A method as recited in claim 1, wherein the active layer includes a photonic structure.

6. A method as recited in claim 1, further comprising providing at least one other substrate over the active layer.

7. A method as recited in claim 6, wherein each of the substrates is comprised of one or more of polycarbonate, polyolefin, polyether sulfone (PES), polyethylene terephthalate (PET), polyethylene naphthalate (PEN), polyimide.

8. A method as recited in claim 1, further comprising providing at least one other multicomponent glass layer between the substrate and the active layer.

9. A method as recited in claim 1, further comprising providing at least one other substrate over the active layer, and providing at least one other multi-component glass layer between the substrate and the active layer.

10. A method as recited in claim 1, wherein the impregnation is done by solution chemistry.

11. A method as recited in claim l, wherein the impregnation is by plasma processing.

\* \* \* \* \*